United States Patent [19]

Paolella et al.

[11] Patent Number: 5,453,630
[45] Date of Patent: Sep. 26, 1995

[54] VARIABLE GAIN OPTICAL DETECTOR

[75] Inventors: Arthur Paolella, Howell, N.J.; Peter R. Herczfeld, Philadelphia, Pa.

[73] Assignee: The United States of America as represented by the Secretary of the Army, Washington, D.C.

[21] Appl. No.: 293,231

[22] Filed: Aug. 19, 1994

Related U.S. Application Data

[63] Continuation of Ser. No. 975,253, Nov. 12, 1992, abandoned.

[51] Int. Cl.⁶ .......................... H01L 27/14; H01L 31/00
[52] U.S. Cl. .......................... 257/187; 257/192; 257/217; 257/443; 257/462
[58] Field of Search .......................... 257/192, 193, 257/194, 187, 217, 257, 258, 290, 431, 443, 462, 463, 449, 453, 280, 448; 307/311

[56] References Cited

U.S. PATENT DOCUMENTS

| | | | |
|---|---|---|---|
| 4,173,764 | 11/1979 | Cremoux | 257/192 |
| 4,717,685 | 1/1988 | Nakajima | 257/472 |
| 4,771,325 | 9/1988 | Cheng et al. | 257/257 |
| 4,805,003 | 2/1989 | Holm et al. | 257/192 |
| 4,859,965 | 8/1989 | Paolella et al. | 330/285 |
| 4,884,119 | 11/1989 | Miller | 257/257 |
| 4,972,237 | 11/1990 | Kawai | 257/280 |
| 5,001,536 | 3/1991 | Fukuzawa et al. | 257/192 |
| 5,091,759 | 2/1992 | Shih et al. | 257/192 |
| 5,107,319 | 4/1992 | Lauterbach et al. | 257/257 |
| 5,196,717 | 3/1993 | Hiroki et al. | 257/257 |
| 5,247,193 | 9/1993 | Menda | 257/462 |

FOREIGN PATENT DOCUMENTS

| | | | |
|---|---|---|---|
| 428146 | 5/1991 | European Pat. Off. | 257/257 |
| 63-305568 | 12/1988 | Japan | 257/257 |
| 2166286 | 4/1986 | United Kingdom | 257/462 |

OTHER PUBLICATIONS

Herczfeld, P. R.: Higgins, T.; Madjar, A.; and Paolella, A.; "Optical Response of the GaAs MESFET at Microwave Frequencies and Applications", IEEE Journal, Jun. 1991.

Herczfeld, P. R.; Madjar, A.; and Paolella, A.; and Sturzebecher, D.; "Optically Controlled GaAs MMIC Switch Using a MESFET as an Optical Detector", *IEEE Journal*, Jun. 1990.

Primary Examiner—William Mintel
Assistant Examiner—Minhloan Tran
Attorney, Agent, or Firm—Michael Zelenka; William H. Anderson

[57] ABSTRACT

An optical detector comprised of a MESFET having a larger than usual separation between its source and drain electrodes and a channel between the source and drain electrodes doped with carriers having a density of at least $10^{18}/cm^3$ whereby variation in the voltage of the gate electrode changes the optical gain.

7 Claims, 4 Drawing Sheets

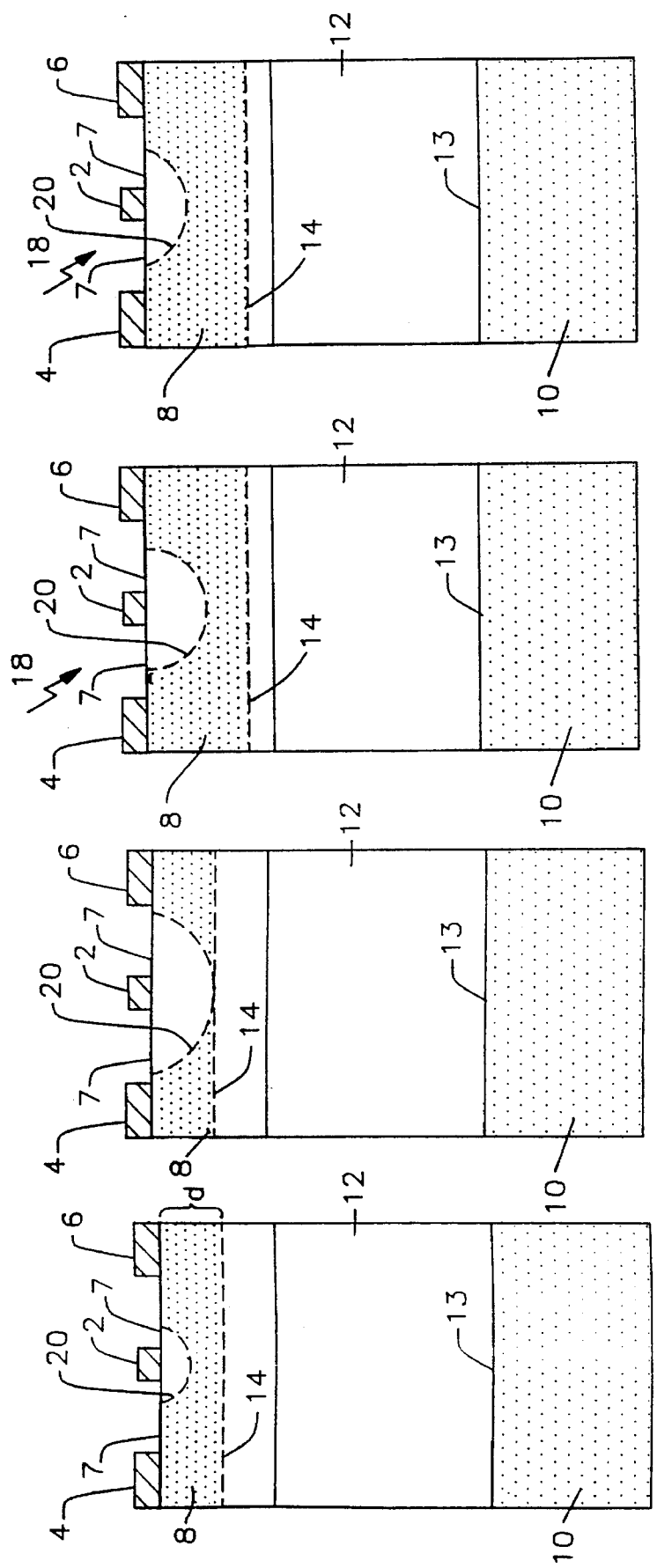

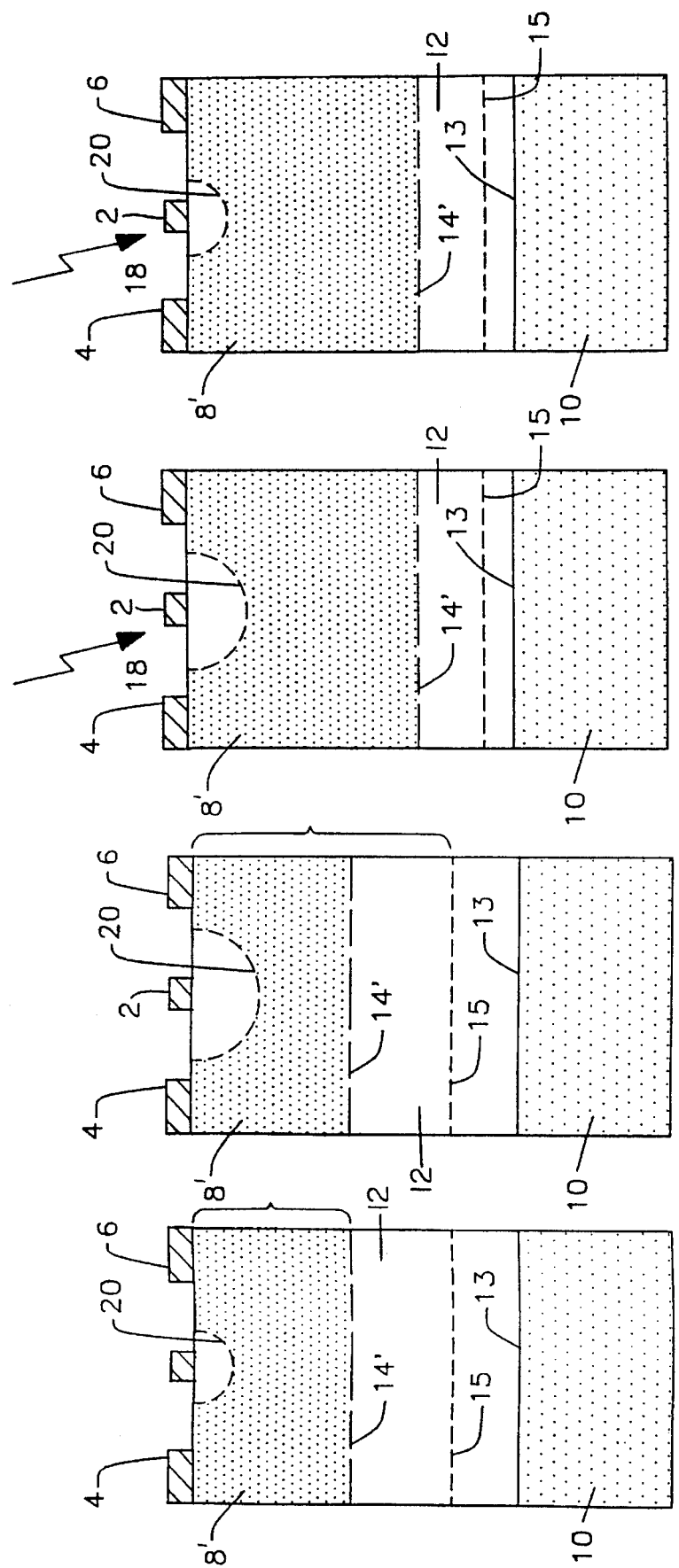

VARIABLE GAIN OPTICAL DETECTOR

GOVERNMENT INTEREST

The invention described herein may be manufactured, used, and licensed by or for the Government of the United States of America for governmental purposes without the payment to us of any royalty thereon.

CONTINUATION APPLICATION

This application is a continuation of U.S. Ser. No. 07/975,253, entitled, "A Variable Gain Optical Detector," filed Nov. 12, 1992, now abandoned.

FIELD OF THE INVENTION

The field of the present invention relates to optical detectors and more particularly to detectors using FET's.

BACKGROUND OF THE INVENTION

Description of the Prior Art

The conventional optical detector is a two terminal device such as a PIN diode that is not electrically controllable. In an article entitled "Optical Response of the GaAs MESFET at Microwave Frequencies and Applications", by the inventors of this application along with A. Madjar and Thomas Higgins, which was published in the June 1991 issue of the Journal of IEEE, it is suggested that the optical sensitivity of a MESFET detector can be improved by separating the source and drain so as to permit more light to enter the device, and in an article entitled "Optically Controlled GaAs MMIC Switch Using a MESFET as an Optical Detector", by A. Paolella, A. Madjar, P. R. Herczfeld and D. Sturzebecher, in the June 1990 issue of the Journal of the IEEE it suggests that a density of $10^{17}$ carriers/cm$^3$ be used.

As explained in the first article, a light detector device is comprised of a channel parallel to a surface thereof that is doped, usually with N type carriers, and a depletion layer or barrier between the channel and a substrate. Spaced source and drain electrodes are mounted in electrical contact with the channel, and a gate electrode is mounted between them. An increase in light energy impinging on the channel in areas between the electrodes causes the channel to become deeper so as to increase its cross section and reduce its resistance, thereby increasing the current flowing between the source and drain electrodes for any given bias voltage between the gate and source electrodes. Thus, variation in the light energy causes a variation in the current produced by the FET.

The concentration of doping in FET amplifiers is not greater than $10^{16}$ carriers/cm$^3$. This again can be controlled by the gate voltage. Although greater concentrations would increase the gain of an amplifier, its output impedance would eventually become so low as to decrease the voltage swing. Furthermore, too high a current density would result from the fact that the depth of the channel decreases with the increase in concentration, and thus could lead to destruction of the amplifier.

U.S. Pat. No. 4,859,965, issued on Aug. 27, 1989, shows a MESFET amplifier in which the gain is changed by varying the illumination light energy on the device.

SUMMARY OF THE INVENTION

In accordance with this invention, the concentration of carriers in a FET detector is at $10^{18}$ or above so as to decrease the depth of the conducting channel from the 0.5 μm it would have in an amplifier to about 0.1 μm. Because the light does not have as far to go to reach the bottom of the channel, it is much less attenuated so that the average intensity of the light in the channel is much greater. Therefore, changes in the amount of light energy impinging on the upper surface of the channel will have a much greater effect on the thickness of the channel and its resistance. In other words, the optical gain of the detector will be much greater than if the concentration of carriers were less than $10^{16}$ carriers/cm$^3$ as in amplifiers, or $10^{17}$ carriers/cm$^3$ as in a prior detector.

In operation, if the gate is biased with respect to the source electrode so as to cut off the flow of current between the source and drain electrodes, a condition known as "pinch-off" at which the upper surface of the conducting channel is depressed until it meets the lower surface so as to prevent conduction between the source and drain electrodes is attained. Now, if some light impinges in the area of the channel between the electrodes, the bottom of the channel is depressed so as to open the channel and allow some current to flow. If this amount of current is not large enough with respect to noise, it can be increased by reducing the bias between the gate and source electrodes so as to raise the top of the conductive channel. As the bias is reduced, the optical gain increases.

As suggested in the second article referred to, the separation between the source and drain electrodes is increased, a separation of 10 μm having been found to provide good results.

A further increase in sensitivity is achieved by making the gate electrode transparent by using known techniques. A detector constructed in accordance with the invention would be very useful in light activated switching, high speed image processing and in a target screen for video cameras.

From a quantitative point of view, the photovoltage, Vph, produced in the channel due to the reduction of the potential barrier under optical illumination, is multiplied by the transconductance of the MESFET so as to produce an output current, Iph, as expressed in equation (1) below:

$$Iph = Vph * gm \tag{1}$$

wherein Vph is the photovoltage and gm is the transconductance.

The photo gain, G, of the detector is expressed by $$\text{Gain} = \frac{hc}{\lambda} \cdot \frac{I_{ph}}{qP_{opt}} \tag{2}$$

wherein h is Plank's constant, c is the speed of light, λ is the wavelength of the optical signal, q is the electronic charge of the photo generated carriers, and $P_{opt}$ is the optical signal power.

BRIEF DESCRIPTION OF THE DRAWINGS

FIG. 3 through 6 respectively illustrate the channel of an optical detector of this invention having a doping of $10^{18}$ carriers/cm$^3$ under the conditions of: no light, no gate bias;

Figure 12:
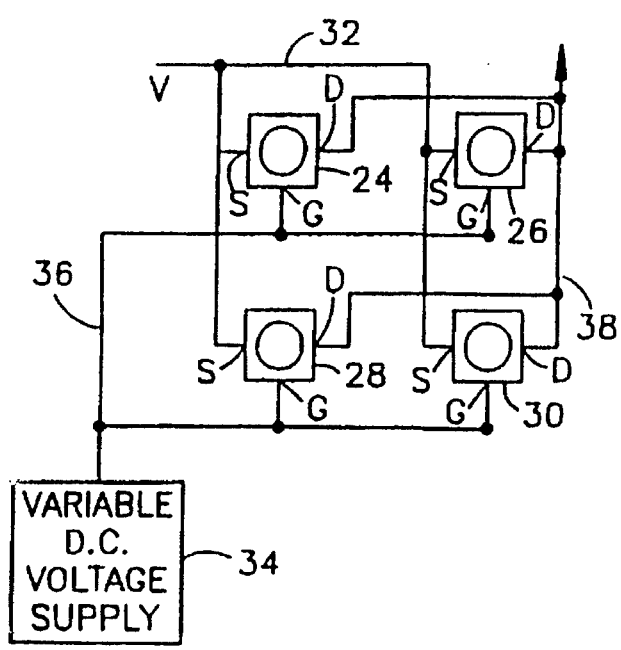
Figure 7:
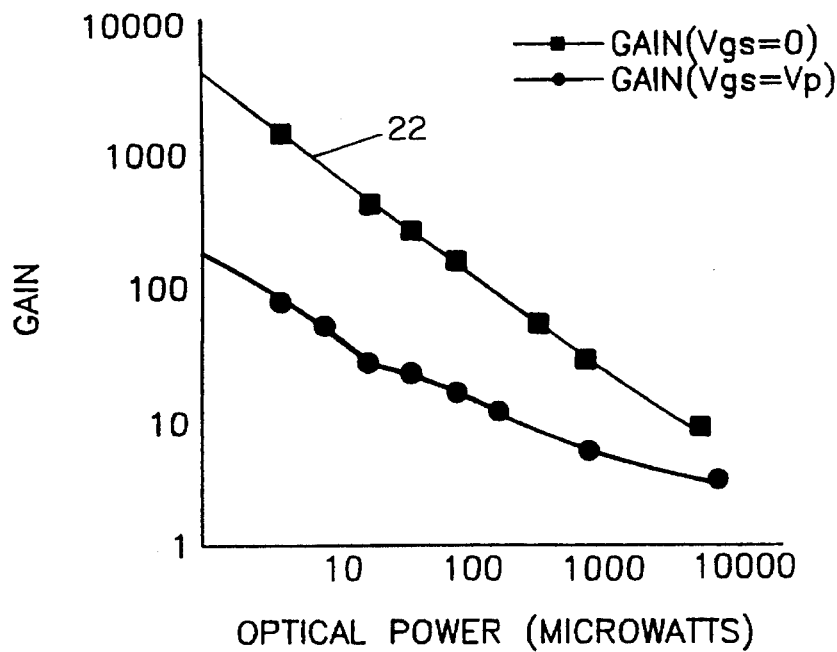
Figure 13:
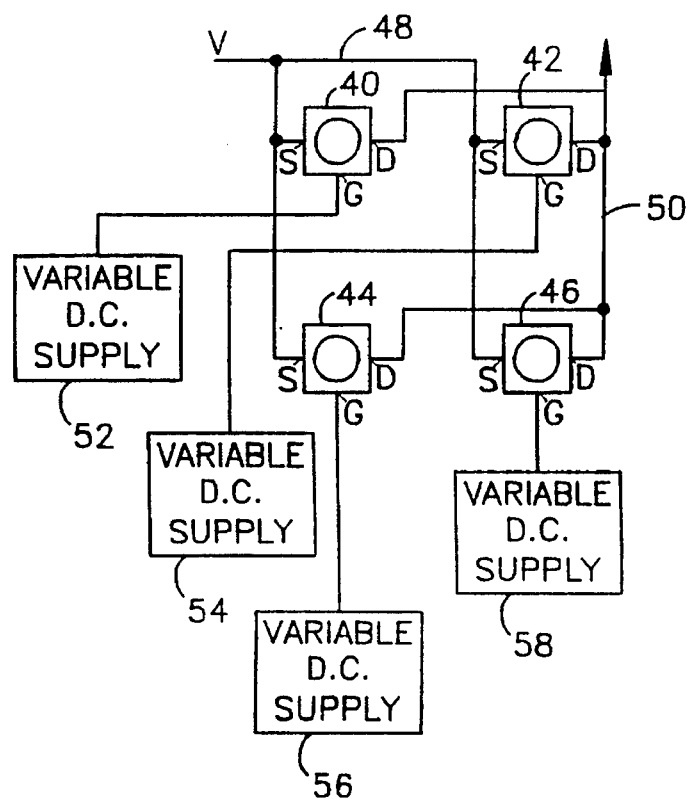

no light, pinch-off gate bias; light and pinch-off gate bias and light and a gate bias less than pinch-off;

FIG. 7 shows graphs of the optical gain vs. the optical power of the light to which a detector of this invention is exposed under a condition of a zero gate to source bias and a gate to source voltage of Vp, which is 1.6 volts;

FIGS. 8 through 11 respectively illustrate the channel of an optical detector of this invention having a doping of $10^{17}$ carriers/cm$^3$ under the same respective conditions of FIGS. 3 through 6, i.e. no light, no gate bias; no light, pinch-off gate bias; light and pinch-off gate bias; and light and a gate bias less than pinch-off. Also shown are the lower ends of the channel under the conditions just stated when the doping density is $10^{16}$ carriers/cm$^3$;

FIG. 12 illustrates an array of optical detectors of this invention in which the gate control voltages are the same; and FIG. 13 illustrates an array of optical detectors of this invention in which the gate control voltages are separate.

For purposes of these Figures and the Detailed Description of the Preferred Embodiment, like reference numerals refer to like elements of the invention.

DESCRIPTION OF A PREFERRED EMBODIMENT

Figure 1:
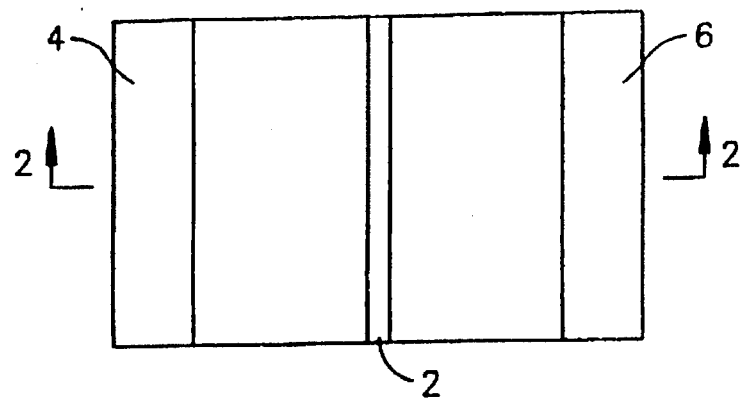
FIG. 1 is a top view of an optical detector of this invention.

FIG. 1 is a top view of an optical detector of this invention in which a gate electrode 2 is shown as being parallel to and spaced from a source electrode 4 and a drain electrode 6.

Figure 2:
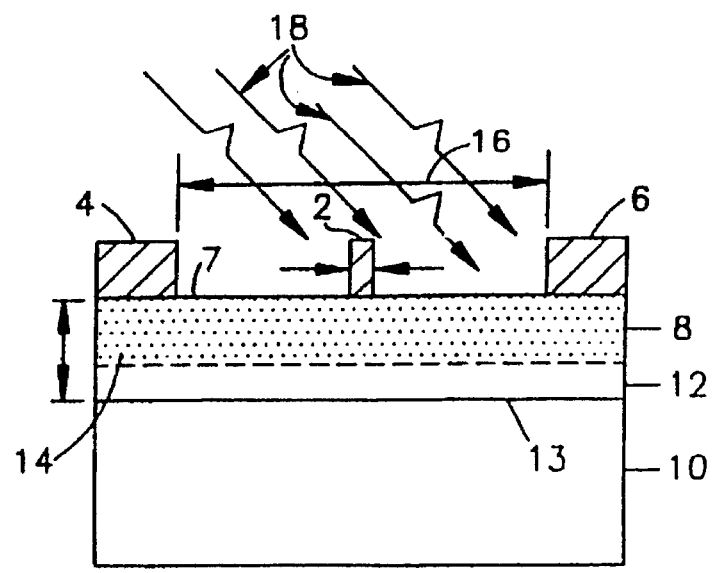
FIG. 2 is a cross sectional view of FIG. 1 taken at 2—2.

In the cross sectional view of FIG. 2 that is taken at 2—2 of FIG. 1, the electrodes 2, 4 and 6 are shown to be made of metal, and to be mounted on an upper surface 7 of a channel 8, having carriers indicated by the dots. The channel 8 is separated from a substrate 10 by a carrier depletion zone 12. A dashed line 14 delineates a potential barrier that is formed along the entire length of the channel and that separates the lower surface of the channel 8 from the depletion zone 12, and a solid line 13 delineates the demarcation between the depletion zone 12 and the substrate 10. Only a few carriers, not shown, are within the substrate 10. The electrodes 2, 4 and 6 are conductively bonded to the channel 8 by a known technique. Preferably GaAs is used as the material for the depletion zone 12 and the substrate 10. If the carriers are injected to form the channel 8, they are preferably injected into GaAs, formed by epitaxy or implantation. Light 18 to be detected is indicated as falling on the upper surface of the channel 8 between arrows 16.

As will be apparent to those skilled in the art, the structure just described is known as a MESFET. Such devices have been used as amplifiers, and as optical detectors. When used as an amplifier, the density of the carriers in the channel is $10^{16}$ carriers/cm$^3$ or less because a higher density would greatly decrease the output impedance of the device so that little voltage swing would result from variations in the gate-to-source voltage. Furthermore, such a high carrier density could cause such high current density as to tend to destroy the device. When used as an optical detector, the density of the carriers was increased, as indicated by the first article, to $10^{17}$ carriers/cm$^3$ in order to increase sensitivity, and the spacing between the source and drain electrodes was increased to let more light fall on the upper surface of the channel.

In accordance with this invention, the density of the carriers in the channel 8 is preferably $10^{18}$ carriers/cm$^3$ or greater, and the separation 16 is 10 μm, for example. It is submitted that one designing a MESFET amplifier would not consider using such a high carrier density as $10^{18}$ carriers/cm$^3$ for the reasons given. In designing an optical detector that is not to be electrically controlled, as in the articles referred to, there would be no suggestion that such a high carrier density would make useful electrical control possible.

The advantage of using a carrier density of $10^{18}$ carriers/cm$^3$ in a channel of a detector of this invention is illustrated by the following discussion of FIGS. 3 through 6, and FIGS. 8 through 11.

In FIG. 3, the depth d of the channel 8 between the upper surface 7 and the dashed line 14 is 0.05 μm, in this example, for a carrier density of $10^{18}$ carriers/cm$^3$ when no light strikes the surface 7 and no voltages are applied to the electrodes. When voltages are applied to the source and drain electrodes 4 and 6 and a pinch-off voltage is applied to the gate electrode 2, the upper surface of channel 8 recedes from the surface 7 as indicated by a dashed line 20 of FIG. 4 so as to reduce the cross section of the channel 8 and the current output at the drain 6 to zero. If some light 18 is allowed to fall on the surface 7, as in FIG. 5, it will penetrate to the surface 20 and enter the channel 8 so as to cause the lower surface 14 of the channel to drop down and open up the channel 8, thus permitting current to flow that is proportional to the light intensity. If, for example, the current is too small, the bias of the gate 2 with respect to the source electrode 4 is decreased from its pinch-off value so as to raise the upper surface 20 of the channel 8 as indicated in FIG. 6, thereby increasing the drain current.

The changes in drain current due to changes in the light intensity or to changes in the bias of the gate 2 are of significant magnitude because the channel 8 is so thin, i.e. a slight change in the light intensity or in the bias voltage causes a large percentage change in the minimum cross sectional area of the channel. Furthermore, the total light power reaching the channel 8 is greater than it would be if the depth of the channel 8 in FIG. 3 were larger as when the carrier density is $10^{17}$ carriers/cm$^3$.

The variations in gain thus achieved in an optical detector constructed in accordance with this invention are illustrated in FIG. 7. With the voltage Vgs between the gate 2 and the source 4, equal to zero, a graph line 22 shows a variation in gain from 5,000 to about 7 as the light intensity or power goes from 1 microwatt to about 2,500 microwatts. With Vgs equal to the pinch-off voltage, Vp, the gain goes from about 200 to 2.5 as the light power goes from 1 to about 2500 microwatts. Keep in mind that gain is the change in drain current for a given change in light power, and that as the cross section of the channel 8 increases with the light power, a given incremental change in light power changes the cross section by a smaller fractional amount.

In order to more clearly understand the advantages resulting from the use of higher carrier densities in the channel 8 than have been previously used, reference is made to FIGS. 8 through 11 that show the changes in the minimum thickness of a channel 8' having a carrier density of $10^{17}$ carriers/cm$^3$ for the same conditions of light and gate voltage as are respectively illustrated in FIGS. 3 through 6. The changes in the vertical position of the surface 14' illustrated in FIGS. 8 through 11 are the same as the changes in position of the surface 14 of FIGS. 3 through 6 but, because the channel 8' of FIG. 8 is thicker than the channel 8 of FIG. 3, the percentage changes in the minimum thickness of the channel 8 are greater than the percentage changes in the thickness of the channel 8'. In fact, the latter percentage changes are undesirably small. These percentage changes decrease with the initial carrier density of a channel so that the optical gain is reduced. The actual reduction in gain is much greater than that indicated by the changes in minimum thickness because, as noted earlier, there is less attenuation of the light when the initial thickness of a channel is less. For similar reasons, the percentage change in gain resulting from changes in voltage on the gate 2 is smaller. Also, in FIGS. 8 through 11, the lower end of the channel is at 15, when the channel 8 has a carrier density of $10^{16}$ carriers/cm$^3$.

An array of optical detectors 24, 26, 28 and 30 that are the same as illustrated by FIGS. 1 and 2 is shown in FIG. 12. In this particular example, a voltage V is coupled via a bus 32 to the source electrodes s of each detector 24, 26, 28, and 30. A source 34 of variable D.C. voltage is coupled to the gate electrodes G via a bus 36, and the drain electrodes D are coupled together so as to provide a common output via a bus 38.

In FIG. 13 an array is illustrated that is comprised of optical detectors 40, 42, 44 and 46 that are like those of FIGS. 1 and 2. A voltage V is coupled to the source electrodes S via a bus 48, and the drain electrodes D are coupled to a common output via a bus 50. Variable D.C. voltage supplies 52, 54, 56 and 58 are respectively connected to the gate electrode G of the detector 40, 42, 44 and 46.

Although various embodiments of the present invention are shown and described herein, they are not meant to be limiting. Those of skill in the art may recognize certain modifications to these embodiments, which modifications are meant to be covered by the spirit and scope of the appended claims.

What is claimed is:

1. An optical detector comprising:
   a substrate;
   a channel formed on said substrate, said channel having a carrier depleted portion and a doped portion which is sufficiently doped so as to form a potential barrier at an interface of said carrier depleted portion and said doped portion, said potential barrier being formed along an entire length of said channel;
   source and drain electrodes mounted in conductive relation with said channel; and
   a gate electrode mounted in conductive relationship with said channel between said source and drain electrodes; and
   a control voltage source electrically connected to said gate, the control voltage applying sufficient voltage such that the current flow between said source and drain electrodes is interrupted;
   wherein incident light to the optical detector lowers the potential barrier of the channel along the entire length of the channel toward the substrate thereby permitting current flow between said source and drain electrodes.

2. An optical detector as set forth in claim 1, wherein said substrate is made of GaAs.

3. An optical detector as set forth in claim 1, wherein the carriers in said channel are N type.

4. An optical detector as set forth in claim 1, wherein said source and drain electrodes are separated by at least 10 μm.

5. An optical detector comprising:
   a MESFET, said MESFET having source and drain electrodes and a gate electrode between them; and
   a channel formed between said source and drain electrodes, said channel having a carrier depleted portion and a doped portion which is sufficiently doped so as to form a potential barrier at an interface of said carrier depleted portion and said doped portion, the potential barrier being formed along an entire length of the channel; and
   a control voltage source electrically connected to said gate, the control voltage applying sufficient voltage such that the current flow between said source and drain electrodes is interrupted;
   wherein incident light to the optical detector lowers the potential barrier of the channel along the entire length of the channel toward the substrate thereby permitting current flow between said source and drain electrodes.

6. An optical detector as set forth in claim 5 wherein said MESFET has a substrate of GaAs.

7. A light sensing array comprising:
   a plurality of MESFETs each having source and drain electrodes, with a gate electrode positioned therebetween; and
   channels formed in each MESFET between its source and drain electrodes, each of said channels having a carrier depleted portion and a doped portion which is sufficiently doped so as to form a potential barrier at an interface of said carrier depleted portion and said doped portion, the potential barrier being formed along entire length of said channels;
   a control voltage source electrically connected to said gate electrodes, the control voltage applying sufficient voltage such that the current flow between said source and drain electrodes is interrupted;
   a bus coupled to said gate electrodes for receiving a gain control voltage from said source voltage;
   a bus coupled to said source electrodes for receiving a supply voltage; and
   a bus coupled to said drain electrodes for providing an output;
   wherein incident light to the array lowers the potential barriers along the entire length of the channels toward the substrate thereby permitting current flow between said source and drain electrodes.

* * * * *